United States Patent
Mori et al.

(10) Patent No.: US 10,756,728 B2
(45) Date of Patent: Aug. 25, 2020

(54) INSULATED GATE DEVICE DRIVE APPARATUS

(71) Applicant: FUJI ELECTRIC CO., LTD., Kawasaki-shi, Kanagawa (JP)

(72) Inventors: Takahiro Mori, Matsumoto (JP); Motomitsu Iwamoto, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/699,401

(22) Filed: Nov. 29, 2019

(65) Prior Publication Data

US 2020/0204174 A1 Jun. 25, 2020

(30) Foreign Application Priority Data

Dec. 19, 2018 (JP) .................... 2018-236886

(51) Int. Cl.
*H03K 17/14* (2006.01)
*H03K 17/687* (2006.01)
*H03K 17/60* (2006.01)

(52) U.S. Cl.
CPC ... *H03K 17/602* (2013.01); *H03K 2217/0081* (2013.01)

(58) Field of Classification Search
CPC ............. H03K 17/602; H03K 2217/0081
See application file for complete search history.

(56) References Cited

U.S. PATENT DOCUMENTS

| | | | | |
|---|---|---|---|---|
| 6,710,583 | B2* | 3/2004 | Stanescu | G05F 1/575 323/280 |
| 7,151,401 | B2* | 12/2006 | Inoue | H03K 17/167 327/434 |
| 7,554,305 | B2* | 6/2009 | Nunokawa | G05F 1/575 323/273 |
| 7,602,595 | B2* | 10/2009 | Hiyama | H03K 17/0828 361/93.7 |
| 8,179,108 | B2* | 5/2012 | Kimura | G05F 1/575 323/280 |
| 9,172,363 | B2* | 10/2015 | Ferianz | H03K 17/04 |
| 2013/0285732 | A1 | 10/2013 | Mori | |
| 2017/0207782 | A1 | 7/2017 | Takizawa | |

FOREIGN PATENT DOCUMENTS

| | | |
|---|---|---|
| JP | 2013219633 A | 10/2013 |
| JP | 2014230307 A | 12/2014 |
| JP | 2017127138 A | 7/2017 |

* cited by examiner

*Primary Examiner* — Kenneth B Wells
(74) *Attorney, Agent, or Firm* — Rabin & Berdo, P.C.

(57) ABSTRACT

An insulated gate device drive apparatus for driving an insulated gate device by using a charging current outputted from a totem-pole output circuit constituted by a high-side output transistor and a low-side output transistor. The insulated gate device drive apparatus includes a charging current correction circuit configured to perform correction to increase the charging current that is decreased by an increased voltage drop of high-side wiring resistance between a power supply and the high-side output transistor.

7 Claims, 3 Drawing Sheets

INSULATED GATE DEVICE DRIVE APPARATUS

CROSS-REFERENCE TO RELATED APPLICATION

This application is based upon and claims the benefit of priority of the prior Japanese Patent Application No. 2018-236886, filed on Dec. 19, 2018, the entire contents of which are incorporated herein by reference.

BACKGROUND OF THE INVENTION

1. Field of the Invention

The embodiment discussed herein is related to an insulated gate device drive apparatus that drives an insulted gate power device such as an insulated gate bipolar transistor (IGBT) or a metal-oxide-semiconductor field-effect transistor (MOSFET).

2. Background of the Related Art

A power conversion apparatus that controls a load such as a motor uses a semiconductor module including, as a single package, a power device that switches the load and a drive circuit that drives this power device. An IGBT or a MOSFET is commonly used as the power device. A totem-pole output circuit may be configured in the output stage in the drive circuit. This totem-pole output circuit may be configured by connecting a transistor that supplies a current and a transistor that sinks a current in series with each other (for example, see Japanese Laid-open Patent Publication No. 2013-219633). Hereinafter, the drive circuit described in Japanese Laid-open Patent Publication No. 2013-219633 will be described.

FIG. 3 is a circuit diagram illustrating a configuration example of a conventional power device drive circuit.

A power device drive circuit 2 illustrated in FIG. 3 turns on or off a power device 1, which is an IGBT, and includes a charging circuit 10, a switching circuit 20, and a discharging circuit 30. The drive circuit 2 is configured by an integrated circuit (IC) and is contained with the power device 1 in a semiconductor module.

The charging circuit 10 includes an operational amplifier 11, an N-channel MOSFET (hereinafter referred to as an NMOS transistor) 12, a resistor 13, and P-channel MOSFETs (hereinafter referred to as PMOS transistors) 14 and 15 and generates a charging current.

The operational amplifier 11 has a non-inverting input terminal that receives a reference voltage VREF externally applied for setting the value of the charging current. The output terminal of the operational amplifier 11 is connected to the gate of the NMOS transistor 12. The source of the NMOS transistor 12 is connected to one terminal of the resistor 13 and the inverting input terminal of the operational amplifier 11. The other terminal of the resistor 13 is connected to a ground GND of the power device 1 and the drive circuit 2. The operational amplifier 11, the NMOS transistor 12, and the resistor 13 constitute a voltage input/current output circuit that generates a current I1 based on the reference voltage VREF. Namely, since the operational amplifier 11 operates in such a manner that the voltage at its inverting input terminal (the voltage across the resistor 13) becomes equal to the reference voltage VREF, the current I1, which is determined by the reference voltage VREF and the resistance value of the resistor 13, flows through the NMOS transistor 12.

The drain of the NMOS transistor 12 is connected to the drain and the gate of the PMOS transistor 14 and the gate of the PMOS transistor 15. The sources of the PMOS transistors 14 and 15 are connected to a line of a power-supply voltage Vcc of the drive circuit 2. The PMOS transistors 14 and 15 constitute a current mirror circuit, and the drain of the PMOS transistor 15 outputs a charging current I2 proportional to the current I1.

The switching circuit 20 includes a level-shift circuit 21 and a PMOS transistor 22. The input terminal of the level-shift circuit 21 is connected to an input terminal of a drive signal, and the output terminal of the level-shift circuit 21 is connected to the gate of the PMOS transistor 22. The drain of the PMOS transistor 22 is connected to the gate of the PMOS transistor 15, and the source of the PMOS transistor 22 is connected to the line of the power-supply voltage Vcc of the drive circuit 2. When receiving a high-level drive signal, the level-shift circuit 21 outputs a low-level signal, sets the PMOS transistor 22 to on, and sets the PMOS transistor 15 to off by short-circuiting the gate of the PMOS transistor 15 and the line of the power-supply voltage Vcc. When receiving a low-level drive signal, the level-shift circuit 21 outputs a signal at the level of the power-supply voltage Vcc, sets the PMOS transistor 22 to off, and sets the PMOS transistor 15 to on.

The discharging circuit 30 includes a buffer 31 and an NMOS transistor 32. The input terminal of the buffer 31 is connected to the input terminal of the drive signal, and the output terminal of the buffer 31 is connected to the gate of the NMOS transistor 32. When receiving a low-level drive signal, the buffer 31 outputs a low-level signal and sets the NMOS transistor 32 to off. When receiving a high-level drive signal, the buffer 31 outputs a high-level signal and sets the NMOS transistor 32 to on.

The drain of the PMOS transistor 15 in the charging circuit 10 is connected to the drain of the NMOS transistor 32 in the discharging circuit 30, and this connection point constitutes an output terminal OUT of the drive circuit 2. This output terminal OUT is connected to the gate of the power device 1. In addition, the ground GND of the drive circuit 2 is connected to the emitter of the power device 1.

The source of the PMOS transistor 15 in the charging circuit 10 is connected to the line of the power-supply voltage Vcc of the drive circuit 2 via wiring resistance 16, and the back gate of the PMOS transistor 15 is connected to the line of the power-supply voltage Vcc. In addition, the source of the NMOS transistor 32 in the discharging circuit 30 is connected to the ground GND via wiring resistance 33, and the back gate of the NMOS transistor 32 is connected to the ground GND. The wiring resistance 16 is the resistance of the wiring that exists unavoidably between a power supply terminal of the power-supply voltage Vcc and the source of the PMOS transistor 15 on the IC substrate. The wiring resistance 33 is the resistance of the wiring that exists unavoidably between a terminal of the ground GND and the source of the NMOS transistor 32 on the IC substrate.

In the charging circuit 10 in the above drive circuit 2, the operational amplifier 11, the NMOS transistor 12, and the resistor 13 generate the current I1 corresponding to the reference voltage VREF, and the PMOS transistors 14 and 15 output the charging current I2 proportional to the current I1.

When receiving a low-level drive signal, the level-shift circuit 21 sets the PMOS transistor 22 to off and sets the PMOS transistor 15 to on, and the charging current I2 is outputted. This charging current I2 is supplied to the gate of the power device 1, and the gate-emitter capacitance and the gate-collector capacitance of the power device 1 are charged. The power device 1 is consequently turned on. In this state, the buffer 31 in the discharging circuit 30 outputs a low-level signal and sets the NMOS transistor 32 to off.

Next, when receiving a high-level drive signal, the level-shift circuit 21 sets the PMOS transistor 22 to on and sets the PMOS transistor 15 to off. Meanwhile, the buffer 31 in the discharging circuit 30 outputs a high-level signal and sets the NMOS transistor 32 to on. As a result, the charges accumulated in the gate-emitter capacitance of the power device 1 are sunk by the NMOS transistor 32 as a discharged current I3, and the power device 1 is turned off.

The wiring resistance exists on the source sides of the high-side output transistor and the low-side output transistor that constitute the totem-pole output circuit in the conventional power device drive circuit. The above wiring resistance unavoidably exists due to the layout of the drive circuit on the IC substrate, and the resistance value depends on the distance between the power supply terminal or the ground terminal and the source of the high-side or low-side transistor. When a large current on the order of amperes flows through the totem-pole output circuit, a voltage drop corresponding to this current occurs in the wiring resistance, and a bias voltage in a reverse direction is applied to the back gate with respect to the source of the high-side or low-side transistor. Consequently, since the threshold voltage of the high-side or low-side transistor is increased due to the back-gate effect, the charging or discharged current that is to flow is decreased. This phenomenon is particularly significant when the drive circuit needs to be arranged at a location away from the power supply terminal or the ground terminal on the IC substrate and problematic in that the power device is not sufficiently driven.

SUMMARY OF THE INVENTION

According to one aspect of the embodiment, there is provided an insulated gate device drive apparatus that drives an insulated gate device by using a charging current outputted from a totem-pole output circuit constituted by a high-side output transistor and a low-side output transistor, the insulated gate device drive apparatus including: a charging current correction circuit configured to perform correction to increase the charging current that is decreased by an increased voltage drop of high-side wiring resistance between a power supply and the high-side output transistor.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, an embodiment will be described in detail with reference to the accompanying drawings.

Figure 1:
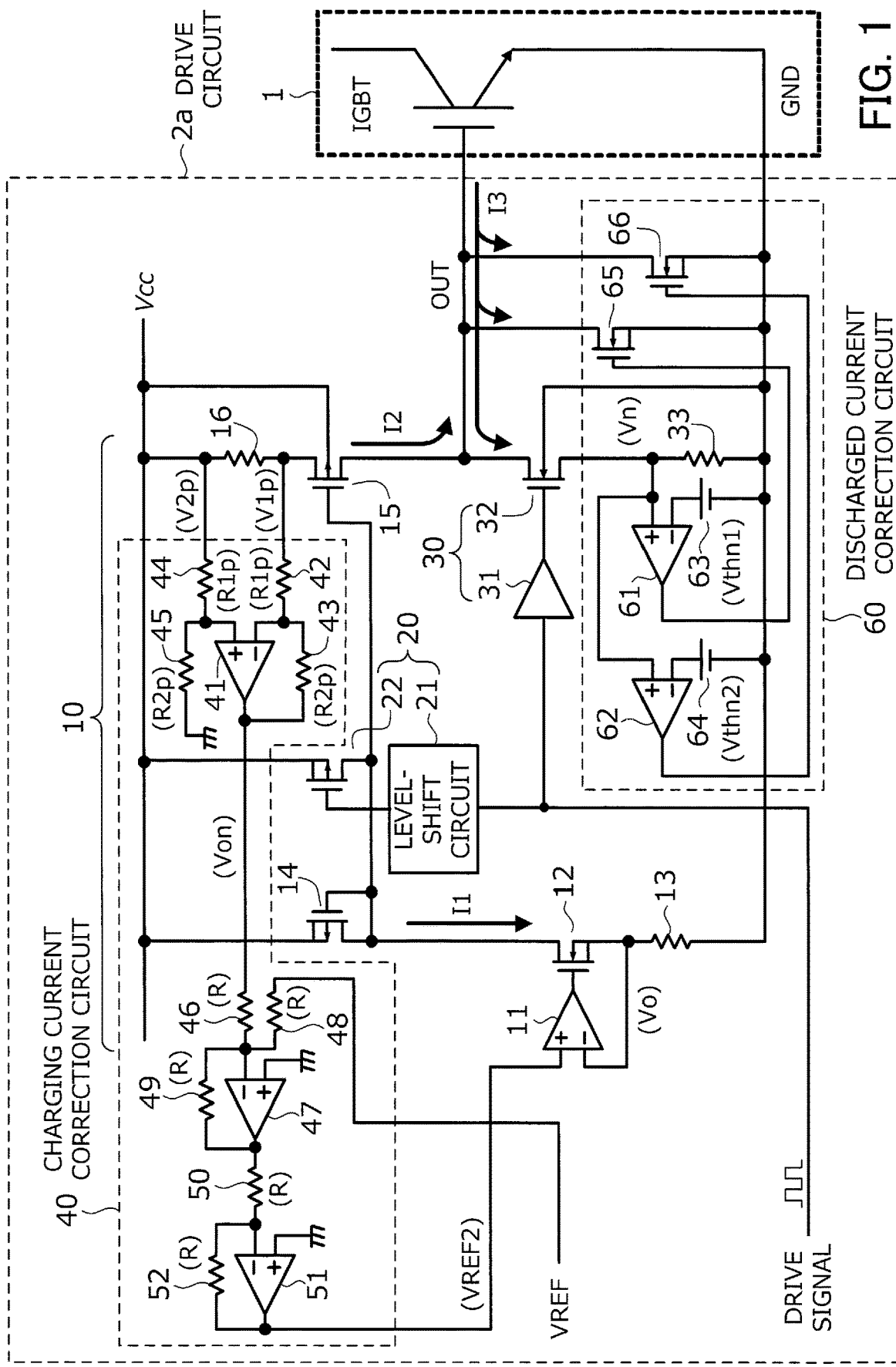
FIG. 1 is a circuit diagram illustrating a configuration example of a power device drive circuit according to an embodiment.
Figure 2:
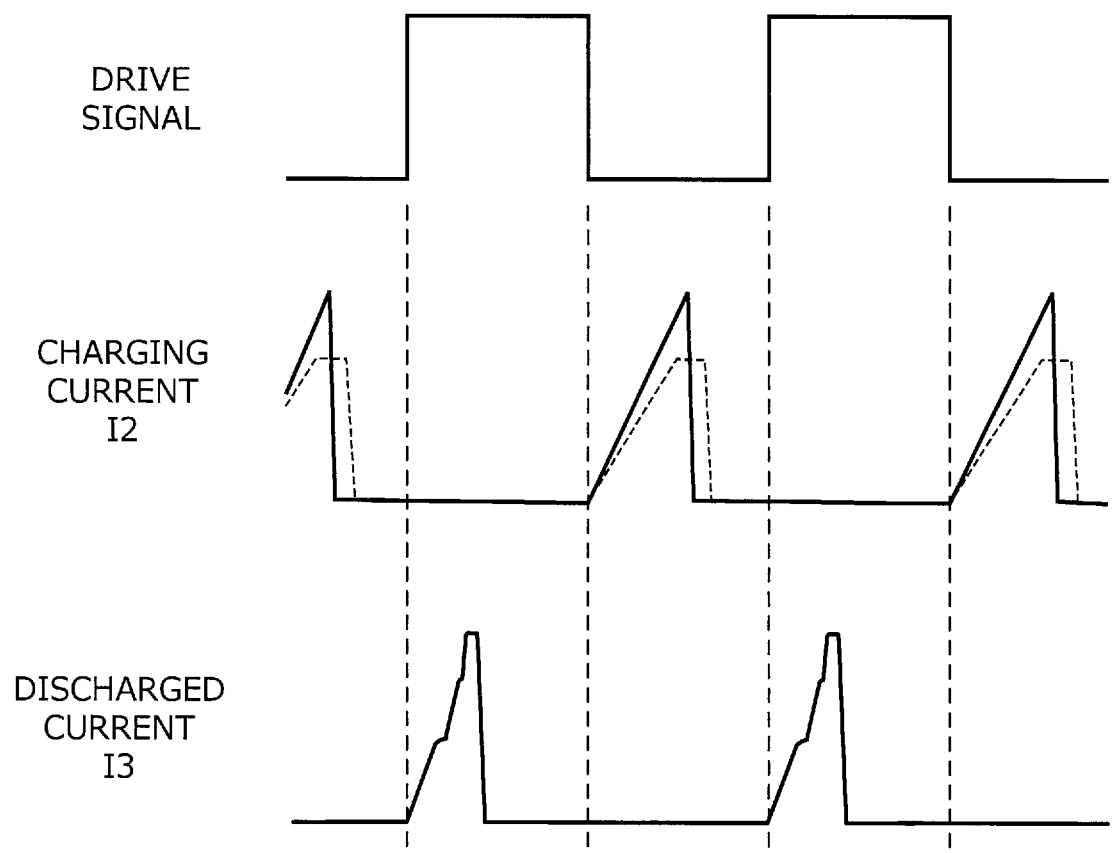
FIG. 2 illustrates waveforms of main portions of the power device drive circuit.
Figure 3:
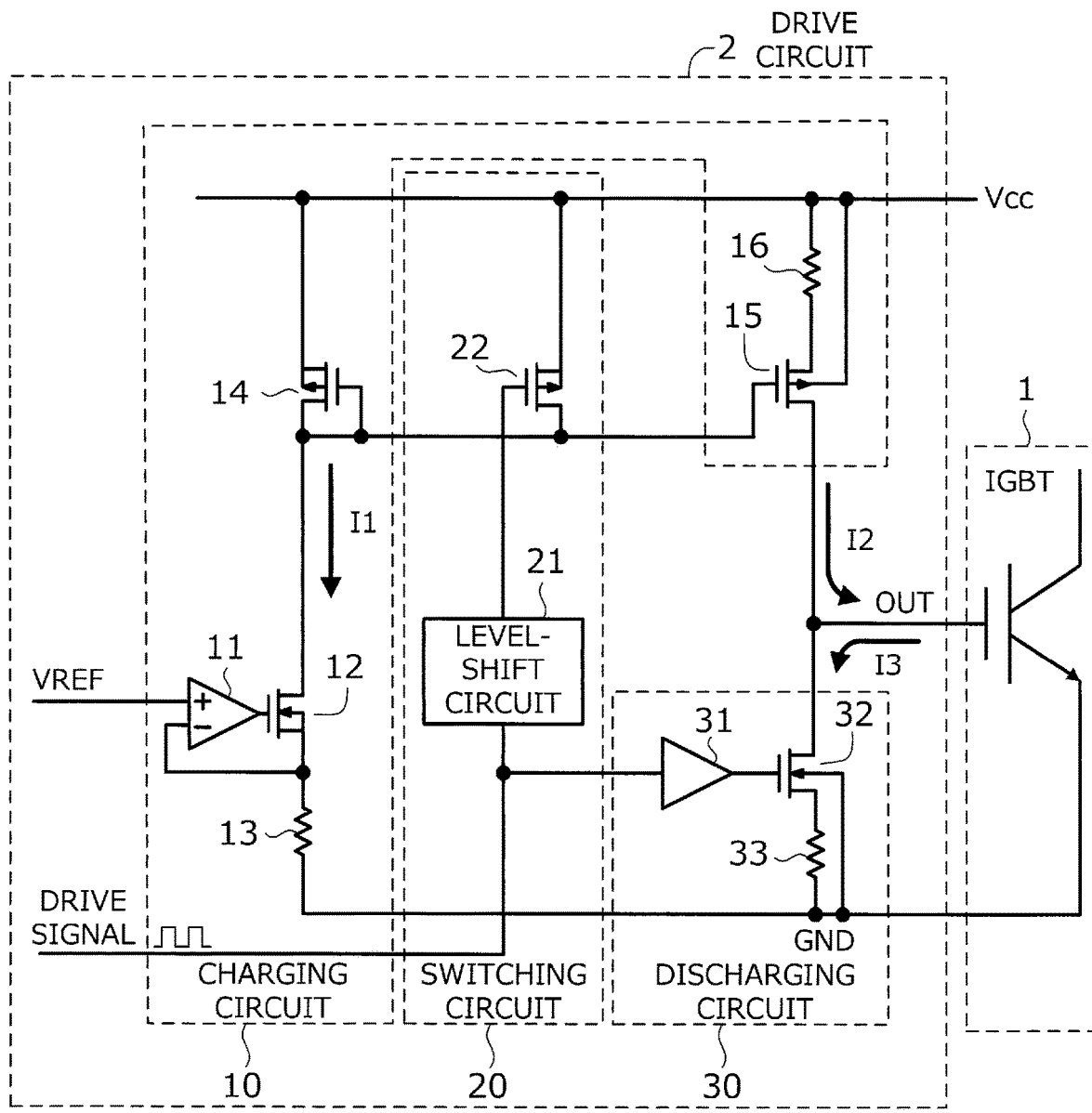
FIG. 3 is a circuit diagram illustrating a configuration example of a conventional power device drive circuit.

FIG. 1 is a circuit diagram illustrating a configuration example of a power device drive circuit according to an embodiment, and FIG. 2 illustrates waveforms of main portions of the power device drive circuit. In FIGS. 1 and 3, like reference characters refer to like elements. In addition, the top, middle, and bottom waveforms illustrated in FIG. 2 represent a drive signal, a charging current I2, and a discharged current I3, respectively.

While a drive circuit 2a for a power device 1, which is an IGBT, illustrated in FIG. 1 is based on the drive circuit 2 illustrated in FIG. 3, the drive circuit 2a additionally includes a charging current correction circuit 40 and a discharged current correction circuit 60 in addition to the drive circuit 2. Namely, this drive circuit 2 on which the drive circuit 2a is based includes: a charging circuit 10 including an operational amplifier 11, an NMOS transistor 12, a resistor 13, and PMOS transistors 14 and 15; a switching circuit 20 including a level-shift circuit 21 and a PMOS transistor 22; and a discharging circuit 30 including a buffer 31 and a NMOS transistor 32. The PMOS transistor 15 is a high-side output transistor, and the NMOS transistor 32 is a low-side output transistor. The PMOS transistor 15 and the NMOS transistor 32 constitute a totem-pole output circuit in the drive circuit 2.

The charging current correction circuit 40 includes an operational amplifier 41. The inverting input terminal of the operational amplifier 41 is connected to one terminal of a resistor 42, and the other terminal of the resistor 42 is connected to the source of the PMOS transistor 15. The inverting input terminal of the operational amplifier 41 is also connected to one terminal of a resistor 43, and the other terminal of the resistor 43 is connected to the output terminal of the operational amplifier 41. The non-inverting input terminal of the operational amplifier 41 is connected to one terminal of a resistor 44, and the other terminal of the resistor 44 is connected to a power supply terminal of a power-supply voltage Vcc. The non-inverting input terminal of the operational amplifier 41 is also connected to one terminal of a resistor 45, and the other terminal of the resistor 45 is connected to ground. In this way, the operational amplifier 41 and the resistors 42 to 45 constitute a differential amplifier circuit that amplifies the potential difference across wiring resistance 16.

The output terminal of the operational amplifier 41 is connected to one terminal of a resistor 46, and the other terminal of the resistor 46 is connected to the inverting input terminal of an operational amplifier 47. The inverting input terminal of the operational amplifier 47 is also connected to one terminal of a resistor 48, and the other terminal of the resistor 48 is connected to an input terminal of a reference voltage VREF. The inverting input terminal of the operational amplifier 47 is also connected to one terminal of a resistor 49, and the other terminal of the resistor 49 is connected to the output terminal of the operational amplifier 47. The non-inverting input terminal of the operational amplifier 47 is connected to ground. The operational amplifier 47 and the resistors 46, 48, and 49 constitute an adder circuit that adds a voltage outputted by the differential amplifier circuit to the reference voltage VREF.

The output terminal of the operational amplifier 47 is connected to one terminal of a resistor 50, and the other terminal of the resistor 50 is connected to the inverting input terminal of an operational amplifier 51. The inverting input terminal of the operational amplifier 51 is also connected to one terminal of a resistor 52, and the other terminal of the resistor 52 is connected to the output terminal of the operational amplifier 51. The non-inverting input terminal of the operational amplifier 51 is connected to ground. The output terminal of the operational amplifier 51 is connected to the non-inverting input terminal of the operational amplifier 11 in the voltage input/current output circuit. The operational amplifier 51 and the resistors 50 and 52 constitute an inverting amplifier circuit in which the polarities of its input and output are opposite to each other with reference to the non-inverting input terminal of the operational amplifier 51.

Next, an operation of the charging current correction circuit 40 will be described. First, in the differential amplifier circuit, the resistance values of the resistors 42 and 44 connected to the inverting input terminal and the non-inverting input terminal of the operational amplifier 41 will be denoted by R1$p$. The resistance value of the resistor 43 connected to the inverting input terminal and the output terminal of the operational amplifier 41 will be denoted by R2$p$. Likewise, the resistance value of the resistor 45 connected to the non-inverting input terminal of the operational amplifier 41 and the ground will be denoted by R2$p$. In addition, the potential of the wiring resistance 16 on the source side of the PMOS transistor 15 will be denoted by V1$p$, and the potential of the wiring resistance 16 on the power supply terminal side of the power-supply voltage Vcc will be denoted by V2$p$. Under this condition, a correction voltage Von outputted by the operational amplifier 41 is represented by (R2$p$/R1$p$)·(V2$p$−V1$p$), which is a value obtained by amplifying the potential difference (V2$p$−V1$p$) across the wiring resistance 16 by the amplification factor (R2$p$/R1$p$) of the operational amplifier 41.

In the adder circuit including the operational amplifier 47 and the inverting amplifier circuit including the operational amplifier 51, if all the resistors 46, 48, 49, 50, and 52 are set to the same resistance value (R), the amplification factor of the operational amplifiers 47 and 51 is represented by 1. Under this condition, the output voltage of the operational amplifier 41 is represented by −(Von+VREF), and the output voltage of the operational amplifier 51 is represented by (Von+VREF)=VREF2. Thus, VREF2 is applied to the non-inverting input terminal of the operational amplifier 11 as a new reference voltage for generating a current I1.

Based on this charging current correction circuit 40, when a high-level logic signal is inputted as the drive signal, the level-shift circuit 21 sets the PMOS transistor 22 to on, and the current mirror circuit constituted by the PMOS transistors 14 and 15 is compulsorily disabled. In this case, since no current flows through the wiring resistance 16, the correction voltage Von outputted by the differential amplifier circuit is 0 volt (V). Thus, the reference voltage applied to the operational amplifier 11 represents VREF2=VREF, and the voltage input/current output circuit generates the current I1 corresponding to the reference voltage VREF.

When a low-level logic signal is inputted as the drive signal, the level-shift circuit 21 sets the PMOS transistor 22 to off and enables the current mirror circuit constituted by the PMOS transistors 14 and 15. When the low-level drive signal is inputted, the PMOS transistor 15 flows the charging current I2 proportional to the current I1, as illustrated in FIG. 2. When the voltage drop of the wiring resistance 16 increases as the value of the charging current I2 increases, the correction voltage Von outputted by the differential amplifier circuit accordingly increases. As a result, since the reference voltage VREF2 applied to the operational amplifier 11 in the voltage input/current output circuit also increases, the value of the current I1 generated also increases, and the value of the charging current I2 also increases.

In this way, the charging current I2 is corrected to increase with the increase of the voltage drop of the wiring resistance 16. Thus, even when the voltage drop of the wiring resistance 16 increases and the charging current I2 (the charging current I2 indicated by a dashed line in FIG. 2) decreases due to the back-gate effect, since the amount of the decrease of the charging current I2 is supplemented by the charging current correction circuit 40, the drive capability is maintained. The charging current I2 does not continuously increase until the PMOS transistor 15 is saturated. When charging of the gate-emitter capacitance and the gate-collector capacitance of the power device 1 is completed, the charging current I2 drops to its minimum value.

The discharged current correction circuit 60 includes comparators 61 and 62, and the non-inverting input terminals of these comparators 61 and 62 are connected to the source of the NMOS transistor 32. The inverting input terminal of the comparator 61 is connected to the positive terminal of a voltage source 63, and the negative terminal of the voltage source 63 is connected to a ground GND. The voltage source 63 outputs a threshold voltage Vthn1, which is a predetermined value used as a reference for comparison of the comparator 61. The inverting input terminal of the comparator 62 is connected to the positive terminal of a voltage source 64, and the negative terminal of the voltage source 64 is connected to the ground GND. The voltage source 64 outputs a threshold voltage Vthn2, which is a predetermined value used as a reference for comparison of the comparator 62. This threshold voltage Vthn2 is set to be higher than the threshold voltage Vthn1. In this way, the comparators 61 and 62 and the voltage sources 63 and 64 constitute a voltage drop detection circuit that detects the value of the voltage drop that occurs in the low-side wiring resistance.

The output terminal of the comparator 61 is connected to the gate of an NMOS transistor 65. The drain of the NMOS transistor 65 is connected to an output terminal OUT, and the source of the NMOS transistor 65 is connected to the ground GND. In this way, the NMOS transistor 65 constitutes a first bypass circuit as a switch element connected in parallel with the series circuit of the NMOS transistor 32 and wiring resistance 33. The output terminal of the comparator 62 is connected to the gate of an NMOS transistor 66. The drain of the NMOS transistor 66 is connected to an output terminal OUT, and the source of the NMOS transistor 66 is connected to the ground GND. In this way, the NMOS transistor 66 constitutes a second bypass circuit as a switch element connected in parallel with the first bypass circuit.

The NMOS transistors 65 and 66 have a smaller value for the allowable drain current that these NMOS transistors 65 and 66 are able to flow, compared with the allowable drain current of the NMOS transistor 32. In addition, the correction amount of the discharged current is small. Thus, if there is enough space on the IC substrate, it is preferable that elements having a larger value for the allowable drain current be used as the NMOS transistors 65 and 66.

Next, an operation of the discharged current correction circuit 60 will be described. First, when a low-level logic signal is inputted as the drive signal, since the output signal of the buffer 31 is also at a low level, the NMOS transistor 32 is in an off-state. In this state, since a voltage Vn across the wiring resistance 33 is 0 V, the comparators 61 and 62 output a low-level output signal. Thus, the NMOS transistors 65 and 66 are in an off-state.

When the drive signal changes to a high-level logic signal, the level of the output signal of the buffer 31 also changes to a high level, and the NMOS transistor 32 is set to on. As a result, the charges accumulated in the gate-emitter capacitance of the power device 1 are sunk by the NMOS transistor 32 as the discharged current I3 and start to turn off the power device 1. At this point, as illustrated in FIG. 2, the value of the discharged current I3 flowing through the NMOS transistor 32 increases. As the value of the discharged current I3 increases, the voltage drop of the wiring resistance 33 also increases, and the voltage Vn across the wiring resistance 33 also increases. Consequently, due to the back-gate effect, the threshold voltage of the NMOS transistor 32 is increased, and the amount of the sinking of the discharged current I3 is decreased.

In this operation, when the voltage Vn across the wiring resistance 33 increases to a value higher than the threshold voltage Vthn1 of the voltage source 63, the comparator 61 outputs a high-level output signal and sets the NMOS transistor 65 to on. Consequently, since part of the discharged current I3 flows through the NMOS transistor 65, the reduction in the amount of sinking of the discharged current I3 is reduced.

When the voltage Vn across the wiring resistance 33 further increases to a value higher than the threshold voltage Vthn2 of the voltage source 64, the comparator 62 outputs a high-level output signal and sets the NMOS transistor 66 to on. Consequently, since part of the discharged current I3 flows through the NMOS transistor 66, the reduction in the amount of sinking of the discharged current I3 is reduced further. Next, after the power device 1 is turned off, when the charges accumulated in the gate-emitter capacitance of the power device 1 disappear, the discharged current I3 decreases to its minimum value.

While the discharged current correction circuit 60 according to the present embodiment includes two pairs of bypass circuits such as the comparator 61 and the NMOS transistor 65 and the comparator 62 and the NMOS transistor 66, the embodiment is not limited to this configuration. The number of correction circuits is not limited to any particular number.

The present embodiment is suitably applicable to a drive apparatus including a plurality of drive circuits 2a, each of which corresponds to the above drive circuit 2a, on a single IC substrate. Namely, for example, when three drive circuits 2a are mounted on a drive apparatus that drives a three-phase motor, each of the drive circuits 2a on the IC substrate differs in the distance from the power supply terminal of the power-supply voltage Vcc and the terminal of the ground GND due to the layout of the drive circuits 2a. Thus, since each of the drive circuits 2a has different high-side wiring resistance and low-side wiring resistance, imbalance could be caused among the drive capabilities of the individual phases. In the case of the drive apparatus for a three-phase motor, by adding the above charging and discharged current correction circuits to each of the drive circuits 2a of the individual phases, the imbalance among the drive capabilities is eliminated.

In addition, while the function of correcting the charging and discharged currents reduced due to the wiring resistance is configured by using an analog circuit in the present embodiment, the same function may be configured by using a digital circuit.

Since the insulated gate device drive apparatus having the above configuration supplements the reduction of the charging current that is caused by occurrence of a potential difference in the high-side wiring resistance, the insulated gate device drive apparatus is advantageous in maintaining the original drive capability of the insulated gate device. In addition, since the insulated gate device drive apparatus supplements the reduction of the discharged current that is caused by occurrence of a voltage drop in the low-side wiring resistance, the insulated gate device drive apparatus is advantageous in maintaining the original drive capability of the insulated gate device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An insulated gate device drive apparatus that drives an insulated gate device by using a charging current outputted from a totem-pole output circuit constituted by a high-side output transistor and a low-side output transistor, the insulated gate device drive apparatus comprising:
   a charging current correction circuit configured to perform correction to increase the charging current that is decreased by an increased voltage drop of high-side wiring resistance between a power supply and the high-side output transistor.

2. The insulated gate device drive apparatus according to claim 1, wherein the charging current correction circuit includes:
   a differential amplifier circuit configured to amplify a potential difference between a first potential at a connection point of the high-side output transistor and the high-side wiring resistance and a second potential at a connection point of the high-side wiring resistance and the power supply, to thereby output a correction voltage;
   an adder circuit configured to add the correction voltage outputted by the differential amplifier circuit to a reference voltage externally applied for setting the charging current; and
   an inverting amplifier circuit configured to invert the polarity of an output voltage of the adder circuit and supply the output voltage to a circuit that generates the charging current.

3. An insulated gate device drive apparatus that drives an insulated gate device by causing a totem-pole output circuit constituted by a high-side output transistor and a low-side output transistor to sink a discharging current from the insulated gate device, the insulated gate device drive apparatus comprising:
   a discharging current correction circuit configured to perform correction to increase the discharging current that is decreased by an increased voltage drop of low-side wiring resistance between the low-side output transistor and a ground terminal.

4. The insulated gate device drive apparatus according to claim 3,
   wherein the discharging current correction circuit includes a voltage drop detection circuit configured to detect a voltage drop that is caused when the discharging current flows through the low-side wiring resistance, and a bypass circuit connected in parallel with a series circuit of the low-side output transistor and the low-side wiring resistance, and wherein, when a value of the voltage drop detected by the voltage drop detection circuit exceeds a predetermined value, a part of the discharging current flows through the bypass circuit.

5. The insulated gate device drive apparatus according to claim 4, wherein the bypass circuit is a switch element configured to be connected to both ends of the series circuit of the low-side output transistor and the low-side wiring resistance and to be set to on when the detected value of the voltage drop exceeds the predetermined value.

6. A drive apparatus for driving an insulated gate device, comprising:

a totem-pole output circuit including a high-side output transistor and a low-side output transistor, the high-side output transistor being connected to a power supply via high-side wiring resistance, the totem-pole output circuit outputting a charging current to drive the insulated gate device; and a charging current correction circuit connected to the high-side wiring resistance, and being configured to perform correction to increase the charging current that is decreased by an increased voltage drop of the high-side wiring resistance.

7. A drive apparatus for driving an insulated gate device, comprising:

a totem-pole output circuit including a high-side output transistor and a low-side output transistor, the low-side output transistor being connected, via low-side wiring resistance, to a ground terminal, the totem-pole output circuit being configured to sink a discharging current from the insulated gate device; and a discharging current correction circuit connected to the low-side wiring resistance, and being configured to perform correction to increase the discharging current that is decreased by an increased voltage drop of the low-side wiring resistance.

\* \* \* \* \*